(12) United States Patent
Stumber et al.

(10) Patent No.: US 11,472,698 B2
(45) Date of Patent: Oct. 18, 2022

(54) METHOD FOR PRODUCING DAMPER STRUCTURES ON A MICROMECHANICAL WAFER

(71) Applicant: Robert Bosch GmbH, Stuttgart (DE)

(72) Inventors: Michael Stumber, Korntal-Muenchingen (DE); Stefan Apelt, Grosserlach-Grab (DE)

(73) Assignee: Robert Bosch GmbH, Stuttgart (DE)

( * ) Notice: Subject to any disclaimer, the term of this patent is extended or adjusted under 35 U.S.C. 154(b) by 43 days.

(21) Appl. No.: 17/222,215

(22) Filed: Apr. 5, 2021

(65) Prior Publication Data

US 2021/0323810 A1    Oct. 21, 2021

(30) Foreign Application Priority Data

Apr. 15, 2020 (DE) .......................... 102020204766.9

(51) Int. Cl.
*B81B 7/00*     (2006.01)
*B81C 1/00*     (2006.01)

(52) U.S. Cl.
CPC ........ *B81B 7/0016* (2013.01); *B81C 1/00484* (2013.01); *B81B 2201/0285* (2013.01); *B81C 2203/01* (2013.01)

(58) Field of Classification Search
CPC . B81B 7/0016; B81B 2201/0285; B81B 7/02; B81B 2207/11; B81C 1/00484; B81C 2203/01; B81C 2201/034; B81C 1/00015
See application file for complete search history.

(56) References Cited

U.S. PATENT DOCUMENTS

| | | | |
|---|---|---|---|
| 2006/0061869 A1* | 3/2006 | Fadel | G02F 1/133526 359/619 |
| 2006/0279025 A1* | 12/2006 | Heidari | B82Y 10/00 264/320 |
| 2010/0192689 A1* | 8/2010 | Ulm | B81B 7/0012 73/430 |
| 2020/0030591 A1* | 1/2020 | Lim | B29C 39/00 |

FOREIGN PATENT DOCUMENTS

| | | |
|---|---|---|
| DE | 69707853 T2 | 6/2002 |
| DE | 20122196 U1 | 9/2004 |
| DE | 102018222685 A1 | 6/2020 |
| DE | 102019205799 A1 | 10/2020 |

OTHER PUBLICATIONS

Ganter, et al.: "UV-curable silicone rubbers open up new fields", Gummi Fasem Kunststoffe, Int'l Polymer Sci. & Tech., 40(7), (2013), pp. T1-T4.

* cited by examiner

*Primary Examiner* — Yasser A Abdelaziez
(74) *Attorney, Agent, or Firm* — Norton Rose Fulbright US LLP; Gerard Messina

(57) ABSTRACT

A method for producing damper structures on a micromechanical wafer. The method includes: providing an at least partially UV-transparent master mold for molding damper structures; inserting and pressing a micromechanical wafer into the master mold so that micromechanical structures in the wafer are aligned in relation to the damper structures; filling the master mold with UV-curing LSR and subsequent UV irradiation; and mold release and removal of the connected structure of the micromechanical wafer with attached dampers. A method for producing a singulated MEMS chip comprising a UV-cured damper is also described.

3 Claims, 2 Drawing Sheets

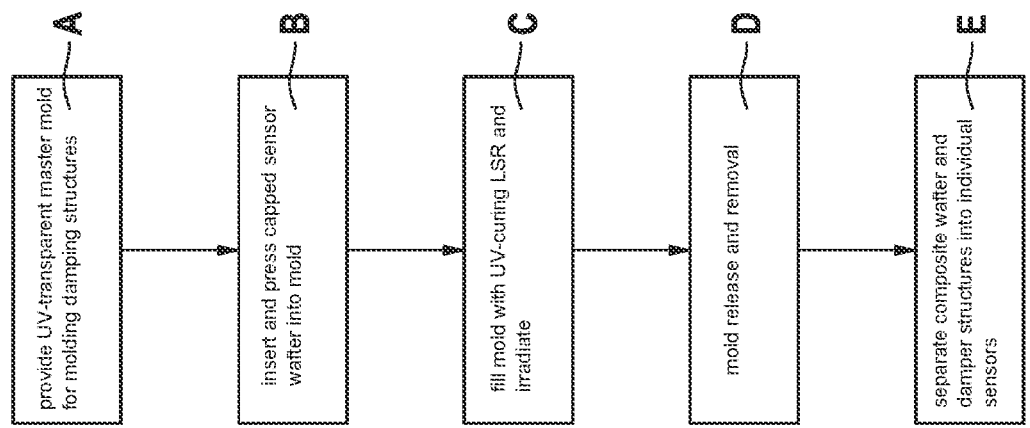
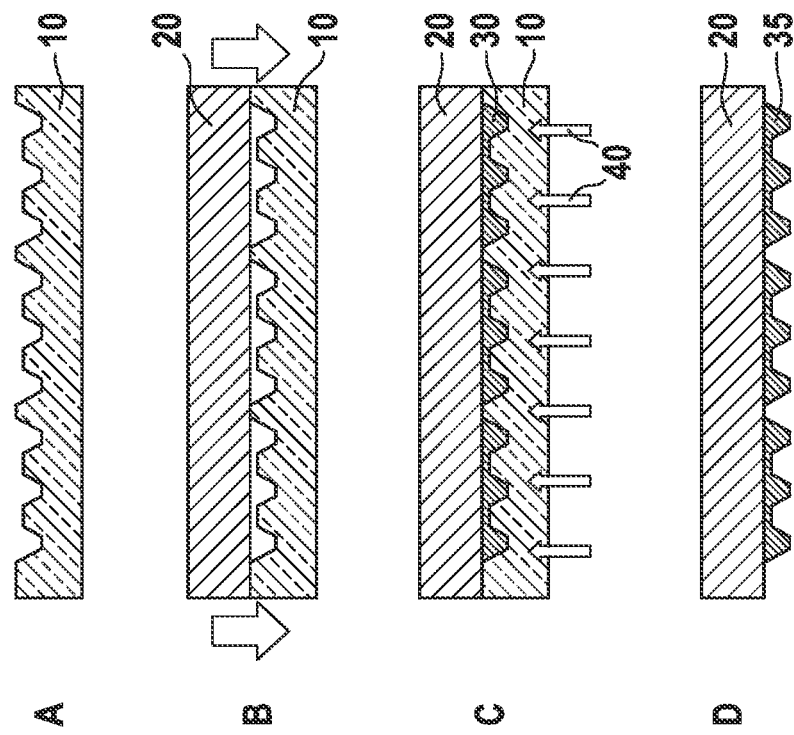
FIG. 1b
FIG. 1a

METHOD FOR PRODUCING DAMPER STRUCTURES ON A MICROMECHANICAL WAFER

CROSS REFERENCE

The present application claims the benefit under 35 U.S.C. § 119 of German Patent Application No. DE 102020204766.9 filed on Apr. 15, 2020, which is expressly incorporated herein by reference in its entirety.

BACKGROUND INFORMATION

The present invention relates to a method for producing damper structures on a micromechanical wafer.

Some MEMS sensors (e.g., rotation-rate sensors) must be supported in a vibration-damped manner depending on installation location and requirements (for example driving dynamics sensors in the engine compartment). Various elaborate approaches are already being used, some of which cushion the entire circuit board or the sensor module in its outer packaging. Alternatively, it is possible to dampen a micromechanical component at the Si chip level by mounting it on a silicone structure. This is additionally intended to temper the mechanical stress in the event of temperature fluctuations.

The existing approaches are challenging or elaborate and costly in terms of the construction, which requires repeated adhesive bonding and very precise positioning. A production of the damper structures at the wafer level and a bonding with the sensor wafer and a subsequent joint singulation allows for a simpler and more precise positioning and requires fewer work steps. German Patent Application Nos. DE 102018222685.7 and DE 102019205799.3 describe methods for producing a micromechanical device having a damper structure, the damper structure being produced at the wafer level on a micromechanical wafer.

SUMMARY

It is an objective of the present invention to create an alternative method for producing damper structures on a micromechanical wafer, which allows for the production of finer and more delicate damper structures, which allow for further miniaturization and improved adaptation to the requirements of the surroundings and conditions of use than conventional approaches.

The present invention relates to a method for producing damper structures on a micromechanical wafer comprising the steps:

A—providing an at least partially UV-transparent master mold for molding damper structures;

B—inserting and pressing a micromechanical wafer into the master mold so that micromechanical structures in the wafer are aligned in relation to the damper structures;

C—filling the master mold with UV-curing LSR and subsequent UV irradiation;

D—mold release and removal of the connected structure of the micromechanical wafer with attached dampers.

The objective of the present invention is achieved by the use of a new class of a materials for the damper structures, which generally makes the production method of the present invention possible.

These are UV-cross-linking silicones or LSR (liquid silicone rubber)—known for example as UV-LSR 2030 or UV-LSR 2060 by the Momentive company. These silicones allow for the separation of mold filling and cross-linking, so that even finer molds may be filled at comparatively low pressure since the process of curing does not already occur during the filling process. The time of curing is controlled by controlling the UV-irradiation and may occur already during the filling of the molds as well as after the conclusion of the filling of the molds. In this context, the time of curing will mainly occur after the conclusion of the filling of the molds.

In contrast to injection molding or compression molding, processing occurs at much lower temperatures. The processing of UV-LSR normally occurs at room temperature, or between 20° C. and 60° C. Compared to thermally cross-linking LSR, in which the processing temperature is between 130° C. and 200° C., UV-cross-linking LSR has the advantage that it is possible to avoid or at least significantly reduce thermal stresses due to different expansion coefficients between sensor (material e.g. silicon) and damper (material, e.g., silicone, PDMS), which can affect the performance, reliability and service life negatively.

The method may be carried out for a complete wafer, as described, but the wafer may also be sawed into several parts, that is, wafer pieces, preferably rectangular, on which the method may be carried out. In the extreme case, the method could also be used on an individual micromechanical sensor.

BRIEF DESCRIPTION OF THE DRAWINGS

FIGS. 1a and 1b show schematically a method according to an example embodiment of the present invention for producing damping structures on a micromechanical wafer.

DETAILED DESCRIPTION OF EXAMPLE EMBODIMENTS

Figure 2:
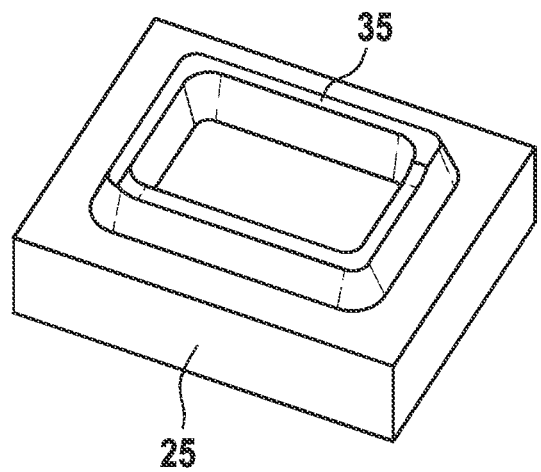
FIG. 2 shows a singulated MEMS chip comprising a UV-cured damper, in accordance with an example embodiment of the present invention.

FIGS. 1a and 1b show schematically a method according to an example embodiment of the present invention for producing damper structures on a micromechanical wafer.

FIG. 1a shows in stages A, B, C, D tools and the device to be produced in various stages of the production method. FIG. 1b shows schematically the production method itself.

In the example shown, the production method features the following steps:

A—providing a UV-transparent master mold 10 for molding damper structures. It is at least partially UV-transparent and part of a molding form.

B—inserting and pressing the capped sensor wafer 20 into mold 10 so that the sensor structures in the wafer are precisely aligned with the damper structures.

There are several possibilities for this alignment: In the most simple case, the alignment may occur via mechanical stops when inserting the wafer. It is also possible, however, to align optically. For this purpose, for example, a microscopic camera image of the alignment structure is recorded and stored. Subsequently, the wafer is inserted, which has corresponding alignment markings, and is shifted with the help of micro-manipulating aids in such a way that the current image of the wafer comes to coincide with the recorded image. If necessary, it is also possible to use an IR-recording for this purpose, which makes it possible to detect structures within the wafer.

C—filling the mold (cavities) with UV-curing LSR 30 and subsequent UV irradiation 40.

D—mold release and removal of the connected structure of sensor wafer 20 with attached dampers 35, in particular with the help of mold release aids.

The micromechanical wafer composite 20 is thus equipped with damper structures 35.

Subsequently, individual MEMS chips having UV-cured dampers may be produced from the wafer composite with damper structures.

For this purpose, in method step E, the composite of wafer and damper structures is separated into individual sensors having their respective dampers, for example by sawing or laser cutting through the wafer composite.

For this purpose, the micromechanical wafer may be a wafer having micromechanical function elements, a wafer piece or a composite wafer, for example made up of a MEMS substrate wafer and a cap wafer.

FIG. 2 schematically shows a micromechanical module having a UV-cured damper. The figure shows a singulated MEMS chip 25 having damper 35 formed on it.

Figure 3:
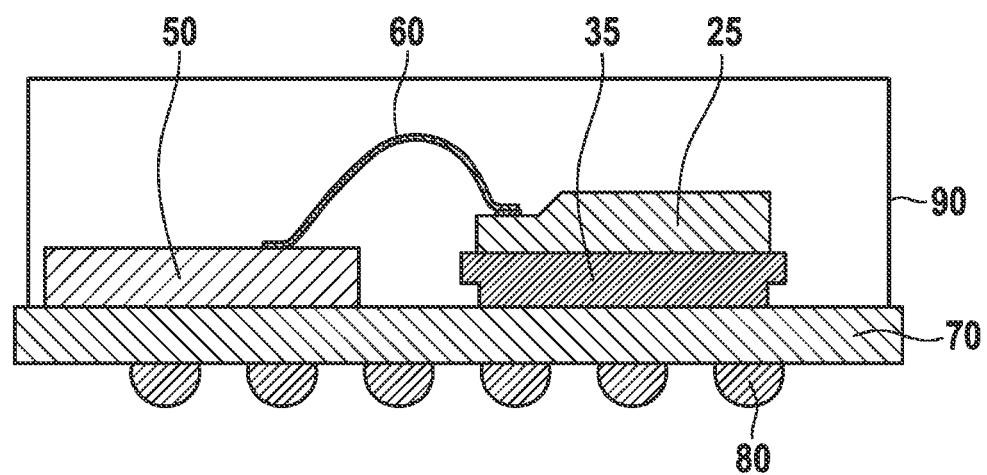
FIG. 3 schematically shows a packaged component including a MEMS chip having a UV-cured damper, in accordance with an example embodiment of the present invention.

FIG. 3 schematically shows a packaged component including a MEMS chip having a UV-cured damper. The figure shows MEMS chip 25 having a damper 35 formed on it, which is fastened with this damper on an upper side of substrate 70. The MEMS chip is electrically connected to an ASIC 50 via bonding wires 60. For electrical contacting, soldering globules 80 (in a BGA, ball grid array) or contact surfaces (in an LGA, land grid array) may be situated on a lower side of the substrate. The ASIC and the MEMS chip are packaged by a housing 90.

LIST OF REFERENCE NUMERALS

10 UV-transparent master mold
20 capped sensor wafer
25 MEMS chip
30 UV-cured LSR
35 damper
40 UV radiation
50 ASIC
60 bonding wire
70 circuit board
80 soldering globule
90 housing

What is claimed is:

1. A method for producing damper structures on a micromechanical wafer, comprising the following steps:
   A. providing an at least partially UV-transparent master mold for molding damper structures;
   B. inserting and pressing a micromechanical wafer into the master mold so that micromechanical structures in the wafer are aligned in relation to the damper structures;
   C. filling the master mold with UV-curing LSR, and subsequent to the filling, UV irradiating the UV-curing LSR; and
   D. releasing the mold and removing a connected structure of the micromechanical wafer with attached dampers.

2. The method for producing damper structures on a micromechanical wafer as recited in claim 1, wherein in step C, the LSR is processed at a temperature of 20-60° C.

3. A method for producing a singulated MEMS chip having a UV-cured damper, comprising the following steps:
   A. providing an at least partially UV-transparent master mold for molding damper structures;
   B. inserting and pressing a micromechanical wafer into the master mold so that micromechanical structures in the wafer are aligned in relation to the damper structures;
   C. filling the master mold with UV-curing LSR, and subsequent to the filling, UV irradiating the UV-curing LSR;
   D. releasing the mold and removing a connected structure of the micromechanical wafer with attached dampers; and
   E. after step D, singulating the micromechanical wafer including attached dampers into chips by sawing the wafer.

* * * * *